(12) United States Patent
Sameshima et al.

(10) Patent No.: US 8,258,043 B2
(45) Date of Patent: Sep. 4, 2012

(54) MANUFACTURING METHOD OF THIN FILM SEMICONDUCTOR SUBSTRATE

(75) Inventors: Toshiyuki Sameshima, Fuchu (JP); Yutaka Inouchi, Kyoto (JP); Takeshi Matsumoto, Kyoto (JP); Yuko Fujimoto, San Jose, CA (US)

(73) Assignees: National University Corporation Tokyo University of Agriculture and Technology, Tokyo (JP); Nissin Ion Equipment Co., Ltd., Kyoto (JP)

( * ) Notice: Subject to any disclaimer, the term of this patent is extended or adjusted under 35 U.S.C. 154(b) by 0 days.

(21) Appl. No.: 13/225,039

(22) Filed: Sep. 2, 2011

(65) Prior Publication Data
US 2012/0077331 A1    Mar. 29, 2012

(30) Foreign Application Priority Data

Sep. 24, 2010 (JP) ................................. 2010-214417

(51) Int. Cl.
*H01L 21/30* (2006.01)
*H01L 21/46* (2006.01)

(52) U.S. Cl. ................. 438/459; 438/458; 257/E21.57; 257/E21.237; 257/E21.568

(58) Field of Classification Search .......... None
See application file for complete search history.

(56) References Cited

U.S. PATENT DOCUMENTS

| 6,140,210 A * | 10/2000 | Aga et al. ........... 438/458 |
| 2011/0097873 A1* | 4/2011 | Lee et al. ........... 438/458 |

FOREIGN PATENT DOCUMENTS

| JP | 2002-305292 A | 10/2002 |
| JP | 2008-294268 A | 12/2008 |
| JP | 2009-158943 A | 7/2009 |
| WO | 01/48825 A1 | 7/2001 |

OTHER PUBLICATIONS

Hydrogen-induced silicon wafer splitting. Fuqian Yang, J. Appl. Phys. 94, 1454 (2003). accepted May 6, 2003).*

* cited by examiner

*Primary Examiner* — Charles Garber
*Assistant Examiner* — Abdulfattah Mustapha
(74) *Attorney, Agent, or Firm* — Sughrue Mion, PLLC

(57) ABSTRACT

A manufacturing method of a thin film semiconductor substrate includes implanting ions at a specified depth into a semiconductor substrate, forming a bubble layer in the semiconductor substrate by vaporizing the ions through heating, bonding an insulating substrate onto the semiconductor substrate, and cleaving the semiconductor substrate along the bubble layer to form a semiconductor thin film on a side of the insulating substrate. At the forming, the semiconductor substrate is heated at a temperature in a temperature range of approximately 1000° C. to 1200° C. for a duration in a range of approximately 10 μs to 100 ms. The heating of the semiconductor substrate is performed by using, for example, a light beam.

9 Claims, 6 Drawing Sheets

MANUFACTURING METHOD OF THIN FILM SEMICONDUCTOR SUBSTRATE

BACKGROUND OF THE INVENTION

1. Field of the Invention

The present invention relates to a manufacturing method of thin film semiconductor substrates. The present invention specifically relates to a manufacturing method of a thin film semiconductor substrate including an ion implantation and cleaving process.

2. Description of the Related Art

A thin film semiconductor substrate typically represented by an SOI (silicon on insulator) substrate has a single crystal semiconductor thin film, for example, of a single crystal silicon, on an insulating substrate. A semiconductor device manufactured using such a thin film semiconductor substrate has sufficient insulation for semiconductor elements along its depth direction. Accordingly, such substrates are appreciated as being useful in manufacturing semiconductor devices requiring high integration and high functionality.

The ion implantation and cleaving process (so-called "smart cut method", registered trademark) is known as a method for manufacturing thin film semiconductor substrates. In this method, first, ions of a light mass element, such as hydrogen, are implanted at a specified depth into a wafer made of a single crystal silicon for an activation layer. Next, an insulating substrate is laminated on an ion implantation side of the wafer for the activation layer. Then, bubbles are generated in the ions introduced into the wafer for the activation layer by causing a change of volume in minute cavities by a heat treatment at a temperature in a range of 400° C. to 700° C. By this process, a bubble layer is formed at the specified depth in the wafer for the activation layer. After formation of the bubble layer, the wafer for the activation layer is cleaved along the bubble layer, which functions as a cleaving surface, thereby obtaining a thin film semiconductor substrate that includes a semiconductor thin film (single crystal silicon thin film) made of the thin wafer for the activation layer on the side of the insulating substrate (refer to Japanese Patent Application Laid-Open No. 2009-158943, specifically the paragraphs 0039 to 0041).

To achieve a high integration density, which includes forming semiconductor elements in a high density on the thin film semiconductor substrate, it is desirable that the thin film has a uniform thickness and the cleaving surface has high flatness. Therefore, the semiconductor elements are formed on the thin film substrate after subjecting the surface (the cleaving surface) of the semiconductor thin film to flattening by polishing.

Meanwhile, in the ion implantation and cleaving process, merging of bubbles takes place during the heat treatment that is performed at the temperature in the range of 400° C. to 700° C. Diameters of bubbles in the bubble layer increase to around 10 nanometers (nm) due to merging of the bubbles. The cleaving surface whose form depends on the shapes of the inner walls of the bubbles becomes uneven when the bubbles have larger diameters. Especially, when manufacturing a semiconductor thin film having a certain high thickness, sufficiently large implantation energy is required in the ion implantation process to introduce ions into a specified depth of the wafer for the activation layer. Large implantation energy leads to a widening of the implantation distribution range of the light mass element ions and an increase in the thickness of the bubble layer, and this makes the cleaving surface still more uneven.

An increase in the unevenness of the cleaving surface increases the polishing work for flattening the cleaving surface and causes a longer TAT (turn around time) and decreases the yield.

The present invention aims to provide a thin film semiconductor substrate manufacturing method that enables forming of the bubble layer with minute bubbles, and as the effect, improves the TAT and the yield.

SUMMARY OF THE INVENTION

A manufacturing method of a thin film semiconductor substrate according to an aspect of the present invention includes implanting ions at a specified depth into a semiconductor substrate, forming a bubble layer in the semiconductor substrate by vaporizing the ions through heating, bonding an insulating substrate onto the semiconductor substrate, and cleaving the semiconductor substrate along the bubble layer to form a semiconductor thin film on a side of the insulating substrate. At the forming, the semiconductor substrate is heated at a temperature in a temperature range of approximately 1000° C. to 1200° C. for a duration in a range of approximately 10 microseconds (µs) to 100 milliseconds (ms). The heating of the semiconductor substrate is performed by using, for example, a light beam hv.

Thus, at the forming, the semiconductor substrate is heated at the temperature in the temperature range of approximately 1000° C. to 1200° C. for an extremely short time, such as approximately 10 µs to 100 ms. Therefore, extremely minute bubbles are formed by ion vaporization at the forming, merging of these bubbles is suppressed, and a bubble layer consisting of extremely minute bubbles can be formed. Accordingly, the surface (cleaving surface) of the semiconductor thin film obtained by cleaving at the bubble layer, which is formed of extremely minute bubbles, has little roughness. As a result, polishing work to flatten the surface of the semiconductor thin film can be reduced.

DETAILED DESCRIPTION OF THE PREFERRED EMBODIMENTS

Exemplary embodiments of the present invention are explained in detail in order below while referring to the accompanying drawings.

FIG. 1 shows cross sectional diagrams for explaining a manufacturing method of a thin film semiconductor substrate according to a first embodiment of the present invention. The manufacturing method according to the first embodiment is explained below with reference to FIG. 1.

Figure 1A:
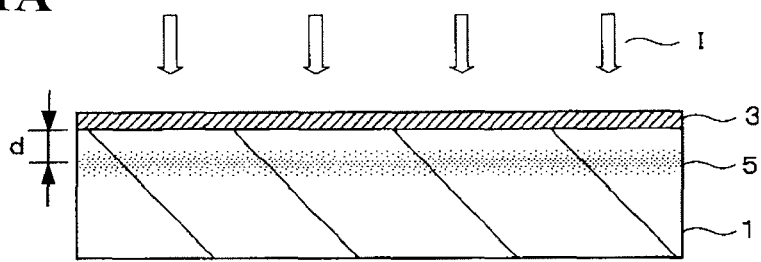
FIG. 1 shows cross sectional diagrams for explaining a manufacturing method according to a first embodiment.

At the first step, as shown in FIG. 1A, a semiconductor substrate 1 that is to be converted into a wafer for an activation layer is prepared. This semiconductor substrate 1 is assumed to be a substrate made of a single crystal silicon or some other semiconductor material having a single crystal property. In this embodiment, a single crystal silicon substrate is used as an example.

At the next step, an oxide film 3 is laminated on the semiconductor substrate 1. The oxide film 3 is used as a protective film at an ion implantation process that is performed later. The oxide film 3 is assumed to be a thermal oxide film formed, for example, by a heat treatment. The oxide film 3 can be formed only when necessary, i.e., the oxide film 3 may not be formed when the protective film is not necessary at the ion implantation process.

At the next step, the ion implantation process is performed to form an ion implantation layer 5 at a specified depth in the semiconductor substrate 1 by implanting ions from a top surface of the semiconductor substrate 1. A depth d at which the ion implantation layer 5 is formed corresponds to a thickness of the semiconductor thin film required for the thin film semiconductor substrate manufactured at this stage. The depth d can be adjusted by controlling the implantation energy depending on the type of the ions used. Hydrogen ions, hydrogen molecular ions, or some other ions of light mass element can be used in the ion implantation process. Helium ions can also be used as the light mass element ions. The light mass element ions are preferable in that the light mass element ions do not cause serious damage to the semiconductor substrate at the ion implantation process. As an example, when the hydrogen molecular ions are used for implantation, the ion implantation layer 5 can be formed at around a depth of 250 nm, i.e., d=250 nm, while suppressing the implantation energy at a level of 60 kilo electron volt (keV) in the ion implantation.

Furthermore, when the hydrogen molecular ions are used for implantation, a dosing density is set to $3 \times 10^{16}$ particles/$cm^2$.

Figure 1B:
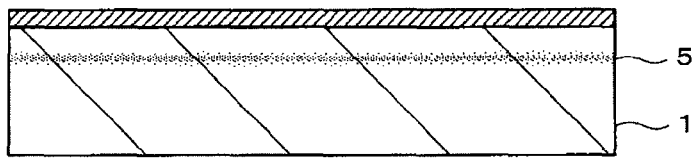

At the next step, as shown in FIG. 1B, the semiconductor substrate 1 is subjected to a heat treatment at a temperature lower than the temperature at which the ions constituting the ion implantation layer 5 vaporize. With the heat treatment, the ions implanted into the semiconductor substrate 1 are reduced to nearly a maximum implantation density, and the thickness of the ion implantation layer 5 in the depth direction, i.e., the distribution of an ion zone is reduced. As an example, when the hydrogen molecular ions are used for implantation, the heat treatment is performed at a temperature that is lower than approximately 400° C., for example, approximately 300° C. The heat treatment can be performed only when necessary, that is, the heat treatment may not be performed when the ion distribution at the ion implantation process is narrow and accordingly the adjustment of the ion distribution is not required.

Figure 1C:
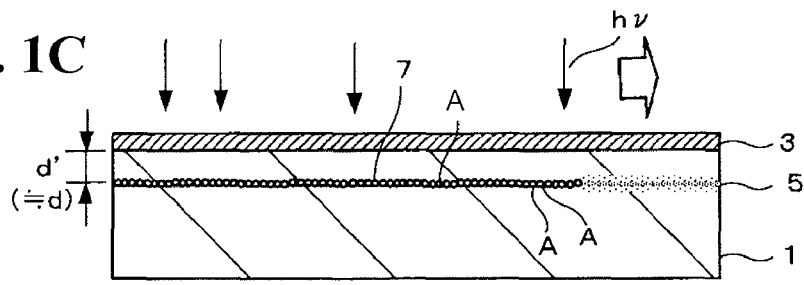

Subsequently, a bubble layer forming process shown in FIG. 1C characterizing the present invention is performed. At the bubble layer forming process, bubbles A are generated by vaporizing the ions implanted into the semiconductor substrate 1 through heating of the semiconductor substrate 1 by irradiating a light beam hv as an energy beam over the whole surface of the semiconductor substrate 1. The bubbles A are formed and distributed at a depth d' from a top surface of the ion implantation layer 5. That is, a bubble layer 7 is formed by the bubbles A distributed at the specified depth d' (≈d). A light absorption layer can be provided on the semiconductor substrate 1 and the semiconductor substrate 1 can be heated via this light absorption layer instead of directly heating the semiconductor substrate 1. When the semiconductor substrate 1 is heated via the light absorption layer, the semiconductor substrate 1 can be heated to a desired temperature in a shorter time. Metals, for example, molybdenum (Mo), or tantalum (Ta), or tungsten (W), besides carbon, can be listed as a material of the light absorption layer.

The light beam hv is assumed to have a wavelength that can be absorbed by the semiconductor substrate 1. For the light beam hv, a laser beam such as a semiconductor laser or a solid state laser that is not restricted by oscillating devices can be used. The laser beam need not be of a single wavelength, but can include a plurality of wavelengths including the light of the wavelength range mentioned above. For example, when the semiconductor substrate 1 is made of a single crystal silicon, a light beam of wavelength approximately 300 nm to 1000 nm like in an infrared semiconductor laser can be used.

Heating of the semiconductor substrate 1 by irradiating the light beam hv is performed by scanning the light beam hv on the oxide film 3 formed on the surface of the semiconductor substrate 1 closer to the bubble layer 7. As a result, the light beam hv is irradiated on the whole surface of the semiconductor substrate 1. Meanwhile, by using a line beam as the light beam hv, the number of required scans can be reduced, and the process can be made faster.

The irradiation of the light beam hv is performed while adjusting an intensity and an irradiation duration (scanning speed) of the light beam hv so that the semiconductor substrate 1 is heated up to a temperature at which the ions introduced in the semiconductor substrate 1 are vaporized. For an exemplary case where the hydrogen molecular ions are implanted into the semiconductor substrate 1 made of a single crystal silicon, the light beam hv is irradiated such that the semiconductor substrate 1 is heated up to a temperature in a temperature range of approximately 1000° C. to 1200° C. for a duration in a range of approximately 10 µs to 100 ms. Such a high temperature heating for a short time can be realized by irradiation of the light beam hv, and cannot be realized by heating with a lamp or heating in a furnace.

The light beam hv is assumed to be irradiated on the surface of the semiconductor substrate 1 that is closer to the bubble layer 7. However, by employing a light beam of a wavelength that can penetrate the semiconductor substrate 1, it is possible to irradiate the surface of the semiconductor substrate 1 that is opposite to the surface shown in FIG. 1C, for example, upon which the light beam impinges.

Figure 1D:
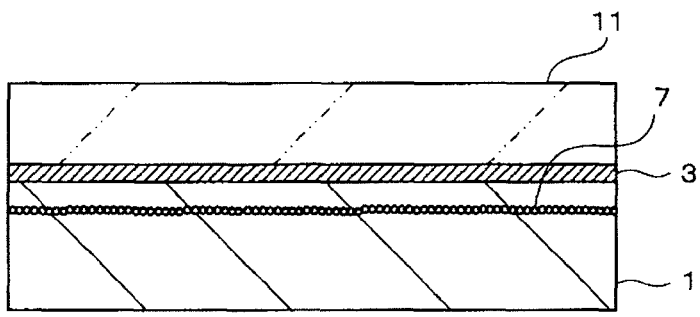

Subsequently, as shown in FIG. 1D, an insulating substrate 11 is laminated on the semiconductor substrate 1. The insulating substrate 11 is laminated on that surface of the oxide film 3 that is closer to the bubble layer 7 of the semiconductor substrate 1.

The purpose of the insulating substrate 11 is to secure insulation at the surface for bonding to the semiconductor substrate 1. Therefore, a substrate formed by laminating a semiconductor substrate, such as a single crystal silicon with oxide films, a glass substrate, a plastic substrate, or a metal substrate laminated with insulating film can be used as the insulating substrate 11.

Figure 1E:
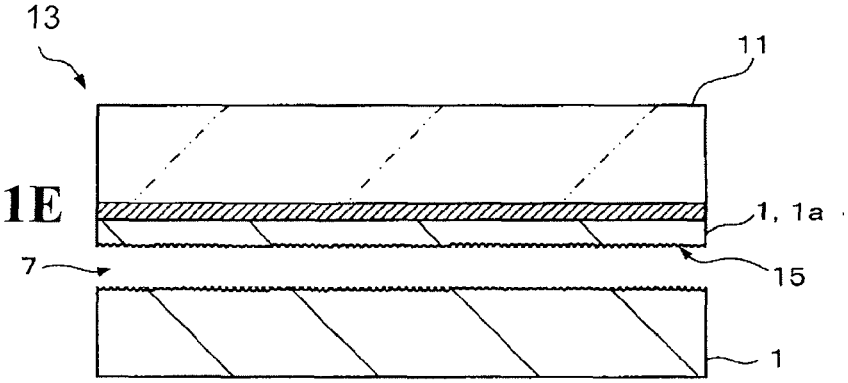

Subsequently, as shown in FIG. 1E, a cleaving process is performed. The cleaving process includes cleaving the semiconductor substrate 1 along the bubble layer 7 as a cleaving surface 15. A semiconductor thin film 1a is formed on the side of the insulating substrate 11 due to cleaving of the semiconductor substrate 1. The semiconductor substrate 1 can be cleaved along the bubble layer 7 through heating or physically impacting the semiconductor substrate 1. When the cleaving is performed through heating, it is preferable that the heating be completed in a short time. If the heating is performed for a long time, a stress may be generated due to a difference in thermal expansion coefficients of the insulating substrate 11 and the semiconductor thin film 1a leading to generation of cracks in the semiconductor thin film 1a.

A thin film semiconductor substrate 13 with the semiconductor thin film 1a formed on the insulating substrate 11 is obtained by the above-mentioned process. A surface of the semiconductor thin film 1a of the thin film semiconductor substrate 13 obtained in this manner assumes a form that depends on the shape of the inner surfaces of the bubbles A of the bubble layer 7.

Figure 2:
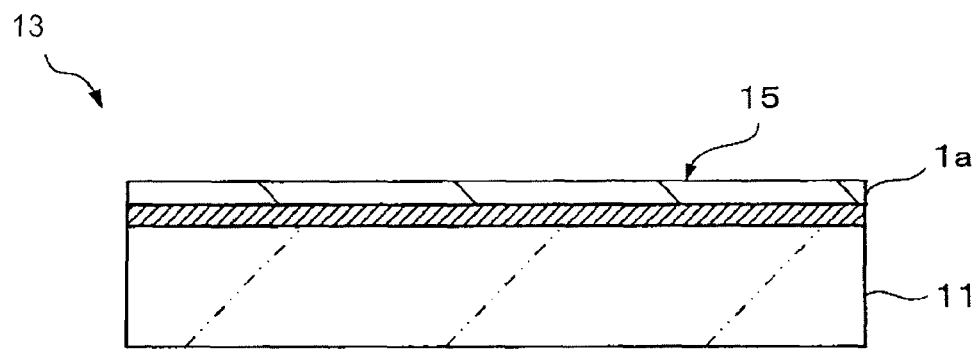
FIG. 2 shows another cross sectional diagram for explaining the manufacturing method according to the first embodiment.

Before using the thin film semiconductor substrate 13 to manufacture a semiconductor device, as shown in FIG. 2, a flattening process is performed to flatten the surface (the cleaving surface 15) of the semiconductor thin film 1a. For example, the surface (the cleaving surface 15) of the semiconductor thin film 1a can be flattened by applying CMP (chemical mechanical polishing). Meanwhile, if required, a thickness of the semiconductor thin film 1a can be reduced to a desired thickness in the flattening process.

Subsequently, a recrystallization process is performed to recover a crystal structure of the semiconductor thin film 1a that had degraded in the ion implantation process. The recrystallization process includes heating the thin film semiconductor substrate 13. The heating can be performed by irradiating the surface of the semiconductor thin film 1a with a laser or light of a lamp, or heating the thin film semiconductor substrate 13 in a furnace. It is preferable that the heating be completed in a short time. If the heating is performed for a long time, a stress may be generated due to a difference in thermal expansion coefficients of the insulating substrate 11 and the semiconductor thin film 1a leading to generation of cracks in the semiconductor thin film 1a.

Subsequently, element separation areas are formed on the semiconductor thin film 1a and the semiconductor elements are formed on activation areas that are separated due to the presence of the element separation areas. The element separation areas are formed even in the depth direction of the semiconductor thin film 1a. As a result, separation among the semiconductor elements formed on each of the activation areas can be secured.

In the manufacturing method according to the first embodiment, the semiconductor substrate 1 is heated by using the light beam hv during the bubble layer forming process explained with reference to FIG. 1C. Accordingly, the ions can be vaporized to form the bubbles A by heating of the semiconductor substrate 1 in a short time and at a high temperature, and the bubbles A can be prevented from merging and forming bubbles of larger diameter. Consequently, the bubble layer 7 containing very minute bubbles A can be formed. As a result, the surface (the cleaving surface 15) of the semiconductor thin film 1a obtained by cleaving along the bubble layer 7, which contains extremely minute bubbles A, can be finished as a surface with little roughness that depends on the shape of the inner surface of the extremely minute bubbles A.

Specifically, at the ion implantation process explained with reference to FIG. 1A, the higher the implantation energy is, the broader the ion distribution in the semiconductor substrate 1 in the depth direction can be achieved, resulting in the formation of a broader ion implantation layer 5. However, by the method according to the first embodiment, the bubbles A will not merge after the bubbles A are formed near a point of maximum implantation density of the ion implantation layer 5 during an initial stage of the bubble layer forming process. Accordingly, the bubble layer 7 containing minute bubbles A can be formed at a uniform depth even at a deeper position in the semiconductor substrate 1. As a result, even if the semiconductor thin film 1a obtained by cleaving the semiconductor substrate 1 at the bubble layer 7 has a certain thickness, its surface (i.e., the cleaving surface 15) will have little roughness that depends on the shape of the inner surface of the extremely minute bubbles A.

Accordingly, the polishing work at the flattening process to flatten the surface (i.e., the cleaving surface 15) of the semiconductor thin film 1a can be reduced, and as a result, the TAT can be shortened and the yield can be improved. The same effect can be achieved even if the semiconductor thin film 1a has a certain higher thickness.

At the bubble layer forming process explained with reference to FIG. 1C, the semiconductor substrate 1 is heated up to a high temperature in an extremely short time. As a result, the crystal structure of the semiconductor substrate 1 that had degraded in the ion implantation process can be recovered to a certain degree. Accordingly, sufficient recrystallization becomes feasible by a process with a suppressed thermal hysteresis at the recrystallization process of the semiconductor thin film 1a. By this measure, it is possible to prevent generation of stress caused due to a difference in thermal expansion coefficients of the insulating substrate 11 and the semiconductor thin film 1a that can result in cracking of the semiconductor thin film 1a.

FIG. 3 shows cross sectional diagrams for explaining salient features of the manufacturing method according to a second embodiment of the present invention. The manufacturing method according to the second embodiment differs from the manufacturing method according to the first embodiment in the point that the bubble layer forming process by irradiating the light beam hv and the process of laminating the insulating substrate 11 are performed in a reverse order. The rest of the processes are substantially similar.

That is, in the manufacturing method according to the second embodiment, the processes similar to the first embodiment explained with reference to FIG. 1A and FIG. 1B are performed first. That is, the oxide film 3 is formed on the surface of the semiconductor substrate 1 and the ion implantation layer 5 is formed next and further the width of the ion implantation layer 5 in the depth direction is narrowed by a heat process as required.

Figure 3A:
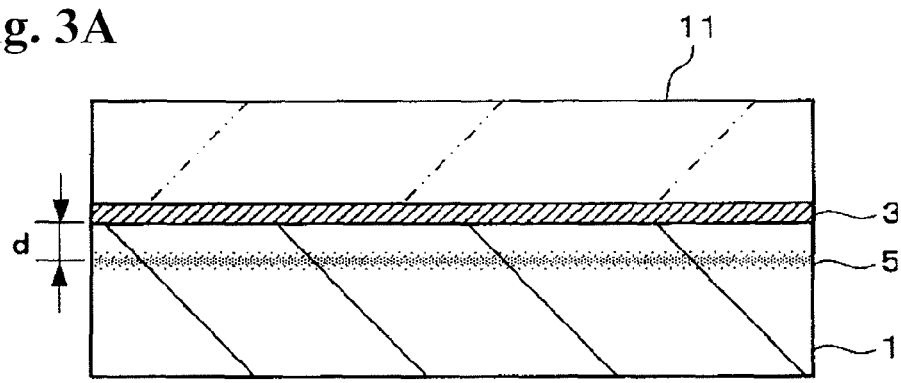
FIG. 3 shows cross sectional diagrams for explaining salient features of a manufacturing method according to a second embodiment.

Subsequently, as shown in FIG. 3A, the insulating substrate 11 is laminated on the semiconductor substrate 1. The insulating substrate 11 is laminated on the surface of the oxide film 3 located close to the ion implantation layer 5 of the semiconductor substrate 1. The insulating substrate 11 is assumed to be made of a material with sufficiently high transparency for the light beam to be used at the next process. The insulating substrate 11 is made of a light transparent material and it functions to secure insulation at a bonding surface with the semiconductor substrate 1. For example, a glass substrate or a plastic substrate can be used as the insulating substrate 11.

Subsequently, the bubble layer forming process shown in FIG. 3B that is the salient feature of the present invention is performed. In the bubble layer forming process, the semiconductor substrate 1 is heated by irradiating the light beam hv as the energy beam on the whole surface of the semiconductor substrate 1, the bubbles A are generated by vaporizing the ions implanted into the semiconductor substrate 1, and the bubble layer 7 is formed by distributing the bubbles A at the depth d' (≈d).

The salient feature of the second embodiment is that the semiconductor substrate 1 is irradiated with the light beam hv from the side of the insulating substrate 11 through the very insulating substrate 11 itself. The irradiation of the semiconductor substrate 1 with the light beam hv is similar to that explained in connection with the first embodiment.

After completion of the processes explained above, the cleavage process similar to that explained with reference to FIG. 1E in connection with the first embodiment is performed. That is, the semiconductor substrate 1 is cleaved along the bubble layer 7 as the cleaving surface 15. Thus, the semiconductor substrate 1 is cleaved along the bubble layer 7, and the thin film semiconductor substrate 13 formed by the semiconductor thin film 1a on the insulating substrate 11 is obtained.

The thin film semiconductor substrate 13 obtained through the processes explained above includes the semiconductor thin film 1a which has a surface (i.e., the cleaving surface 15) of the form same as the inner surfaces of the bubbles A in the bubble layer 7 similar to that in the first embodiment. Accordingly, as explained in FIG. 2 in connection with the first embodiment, the flattening process for flattening the surface (the cleaving surface 15) of the semiconductor thin film 1a in the thin film semiconductor substrate 13 is performed by polishing, for example, with the CMP. In the flattening process, if required, the thickness of the semiconductor thin film 1a is reduced to a desired thickness. Next, the recrystallization process is performed to recover the crystal structure of the semiconductor thin film 1a that had degraded in the ion implantation process. The recrystallization process includes heating.

Subsequently, the element separation areas are formed on the semiconductor thin film 1a and the semiconductor elements are formed on the activation areas that are separated due to the presence of the element separation areas. The element separation areas are formed even in the depth direction of the semiconductor thin film 1a. As a result, separation among the semiconductor elements formed on each of the activation area can be secured.

The heating of the semiconductor substrate 1 with the light beam hv is performed at the bubble layer forming process explained with reference to in FIG. 3B also in the manufacturing method according to the second embodiment. As a result, like the first embodiment, the bubble layer 7 containing the extremely minute bubbles A can be formed and the roughness of the cleaving surface 15 obtained by cleaving the semiconductor substrate 1 can be reduced. As a result, the polishing work at the flattening process for flattening the surface (the cleaving surface 15) of the semiconductor thin film 1a can be reduced. As a result, improvement of the TAT and the yield of the manufacturing of the semiconductor devices using the thin film semiconductor substrate 13 can be achieved.

Also, like in the first embodiment, because the crystal structure of the semiconductor substrate 1 that had degraded in the ion implantation process can be recovered to a certain degree at the bubble forming process, generation of cracks in the semiconductor thin film 1a can be prevented by reducing the thermal hysteresis at the recrystallization process of the semiconductor thin film 1a.

Figure 3B:
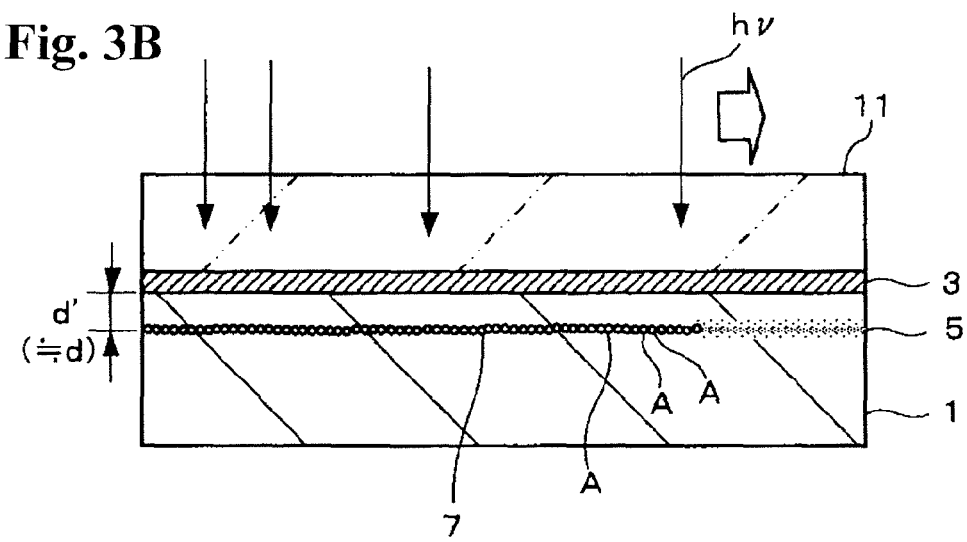

Moreover, because the heating of the semiconductor substrate 1 is performed by using the light beam hv specifically in the bubble layer forming process shown in FIG. 3B, the stress caused due to the difference in the thermal expansion coefficients of the semiconductor substrate 1 and the insulating substrate 11 can be suppressed and the damage of the semiconductor substrate 1 and the insulating substrate 11 can be prevented. Accordingly, the process of forming the bubble layer 7 that includes heating of the semiconductor substrate 1 can be performed after laminating the insulating substrate 11.

Incidentally, in the first embodiment and the second embodiment, the method of heating the semiconductor substrate at the bubble layer forming process by using the light beam hv is employed. At the bubble layer forming process, it is important to form the bubbles of a diameter as small as possible. For this purpose, heating of the semiconductor substrate by scanning with the light beam hv for a short time at the bubble layer forming process is effective. Meanwhile, other methods of heating can also be adopted as long as they allow heating of the semiconductor substrate in a very short time up to a temperature in the temperature range of approximately 1000° C. to 1200° C. Like the examples explained above, where the hydrogen molecular ions are implanted into the semiconductor substrate 1 made of a single crystal silicon, the semiconductor substrate 1 can be heated up to a temperature in the temperature range of 1000° C. to 1200° C. for a duration in the range of 10 μs to 100 ms.

The following examples (1) to (4) can be listed as concrete examples of the heating methods.

(1) A carbon heating body heated up to approximately 1200° C. or higher is arranged adjacent to the surface of the semiconductor substrate 1, without bringing it in contact with the semiconductor substrate 1, and moved at a high speed, thereby heating the semiconductor substrate 1. The carbon heating body can be heated by irradiating it with light energy (refer to the Japanese Patent Application Laid-open No. 2007-115926). For example, the carbon heating body can be arranged near the ion implantation layer of the semiconductor substrate 1 and moved at a high speed.

(2) Electrodes are formed on the semiconductor substrate 1 and an electric current is passed through the electrodes to generate Joule's heat (refer to Applied Physics A73, pp. 419-423). For example, the electrodes can be formed on the semiconductor substrate 1 through a chrome film and the electric current can be passed through these electrodes.

(3) The semiconductor substrate 1 is irradiated with a thermal plasma beam as the energy beam to heat the semiconductor substrate (refer to Japanese Journal of Applied Physics, Vol. 45, No. 5B (2006), pp. 4313-4320). For example, the ion implantation surface of the semiconductor substrate 1 can be scanned with the thermal plasma beam.

(4) The semiconductor substrate 1 is heated by irradiating with an electron beam as the energy beam. For example, the ion implantation surface of the semiconductor substrate 1 can be scanned with the electron beam.

The oxide film 3 of thickness approximately 100 nm was formed by the heat process on the surface of the semiconductor substrate 1 made of single crystal silicon. The ion implantation layer 5 was formed at the specified depth in the semiconductor substrate 1 by implanting hydrogen molecular ions into the semiconductor substrate 1 from a side of the oxide film 3 with an implantation energy of 60 keV and the dosing density of $3 \times 10^{16}$ particles/cm$^2$.

Figure 4:
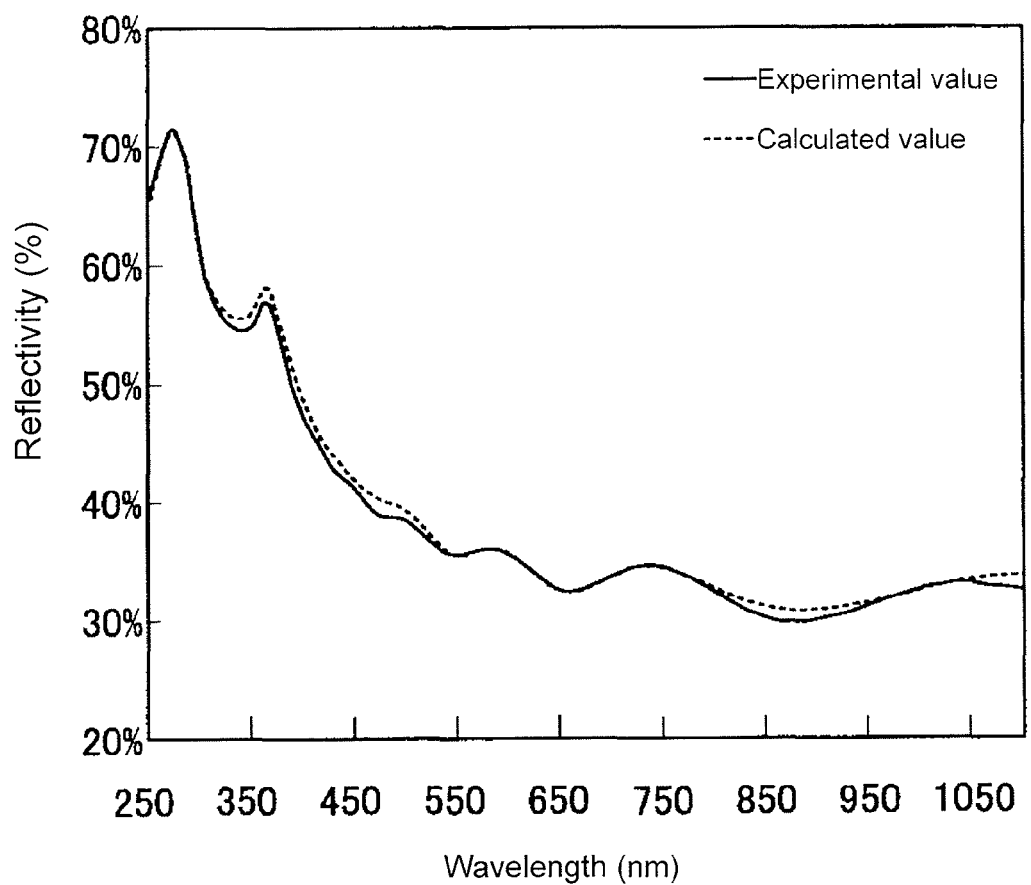
FIG. 4 shows an optical reflectivity spectrum of a hydrogen molecular ion implantation surface of a semiconductor substrate.

After completion of the above processes, an optical reflectivity spectrum of the hydrogen molecular ion implantation surface on the semiconductor substrate 1 was measured to check transition of the crystal structure of the semiconductor substrate 1 in the ion implantation process. The oxide film 3 was removed to expose the single crystal silicon surface of the semiconductor substrate 1, and the optical reflectivity spectrum was measured on this exposed surface. The result of the measurement is shown in FIG. 4 as an experimental value. As indicated by the experimental value in FIG. 4, a moderate vibration waveform could be observed at a visible or near infrared range of wavelength 450 nm or longer in the measured optical reflectivity spectrum.

Figure 5:
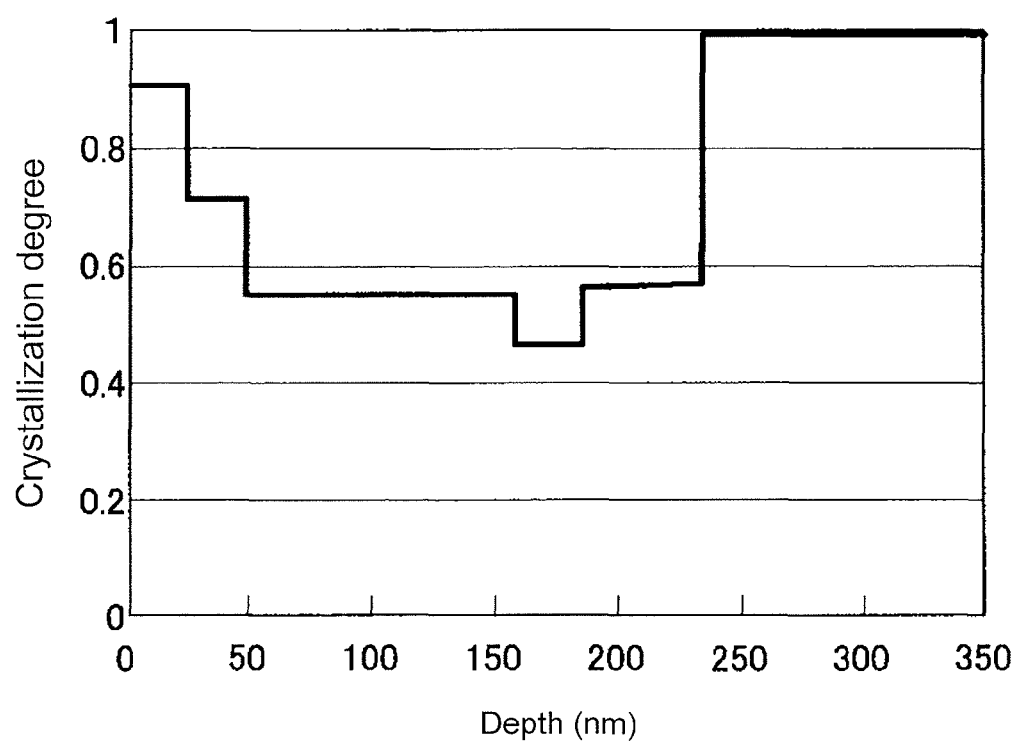
FIG. 5 shows a depth profile of a crystallization degree of a semiconductor substrate obtained from a numerical analysis of the optical reflectivity spectrum shown in FIG. 4.

A depth profile of a crystallization rate was calculated as shown in FIG. 5 based on a numerical analysis of the experimental value of the optical reflectivity spectrum shown in FIG. 4. The calculation of the depth profile of the crystallization rate from the optical reflectivity spectrum was performed as follows.

The optical reflectivity spectrum was calculated using a computer assuming that the semiconductor substrate 1 for which the optical reflectivity spectrum was measured has a multilayered structure. A crystallization rate and a film thickness of each layer of the multilayer structure are shifted and the optical reflectivity spectrum was calculated by using the Fresnel's coefficient method considering a light interference effect. The crystallization rate and the film thickness of each layer were input such that this calculated value matches the measured optical reflectivity spectrum (up to here, refer to Japanese Patent Application Laid-open No. 2008-124083). Incidentally, the optical reflectivity spectrum calculated in this way is shown in FIG. 4 with a broken line as a calculated value.

As shown in a profile of FIG. 5 calculated in this manner, it was observed that the crystallization rate of silicon dropped in a region from the surface to a depth of 240 nm. The region with the degraded crystallization rate coincides with the region where the hydrogen molecular ions were implanted, and the crystals could have been partly destroyed due to a damage caused due to the implantation of the hydrogen molecular ions.

Furthermore, the semiconductor substrate 1 was heated for 1 ms at a temperature of 1050° C. by irradiating an infrared semiconductor laser of wavelength 940 nm as the light beam hv and the bubble layer 7 was formed.

Figure 6:
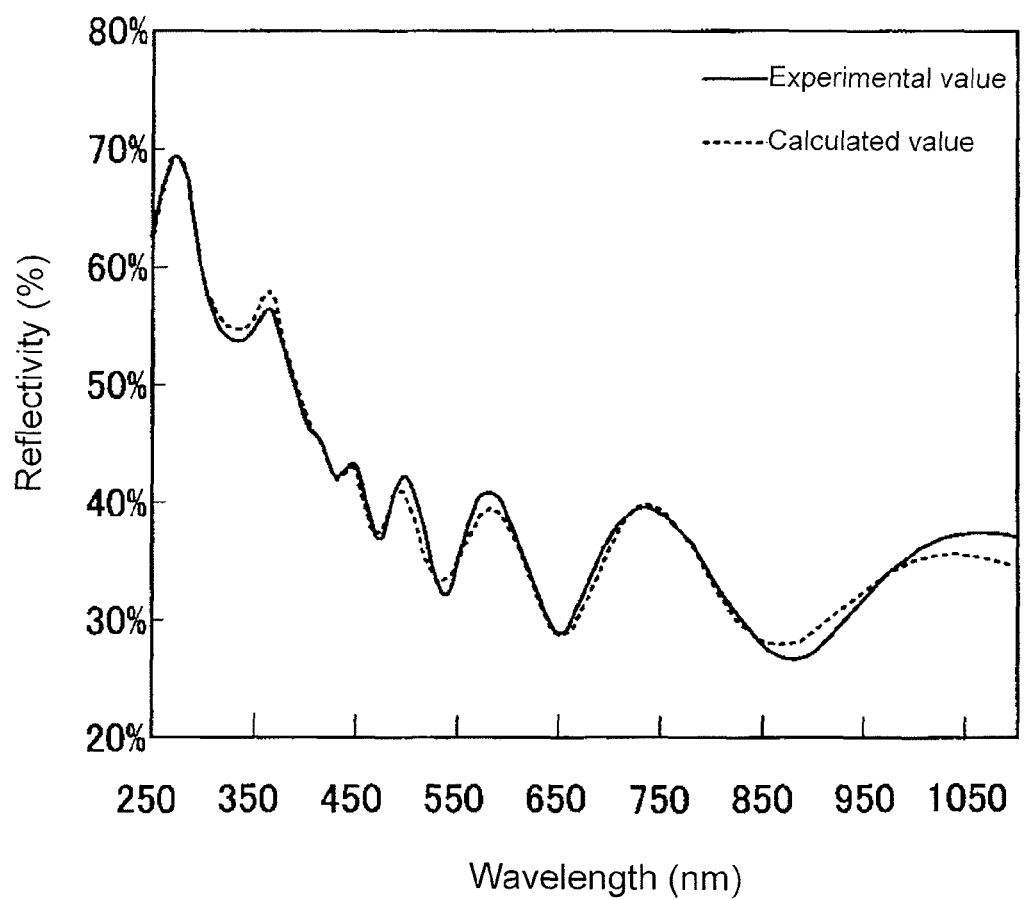
FIG. 6 shows an optical reflectivity spectrum of a hydrogen molecular implantation surface of a semiconductor substrate after the semiconductor substrate is irradiated with a light beam.

Subsequently, the optical reflectivity spectrum on the hydrogen molecular ion implantation surface of the semiconductor substrate 1 was measured in the same way as explained with reference to FIG. 4 to check transition of the crystal structure of the semiconductor substrate 1 due to the irradiation of the light beam hv. The result is shown in FIG. 6 as an experimental value. The optical reflectivity spectrum shown in FIG. 6 differs drastically from the optical reflectivity spectrum shown in FIG. 4. That is, an oscillation waveform of the visible or near infrared range of wavelength 450 nm or shorter is conspicuously enhanced in the optical reflectivity spectrum shown in FIG. 6.

Figure 7:
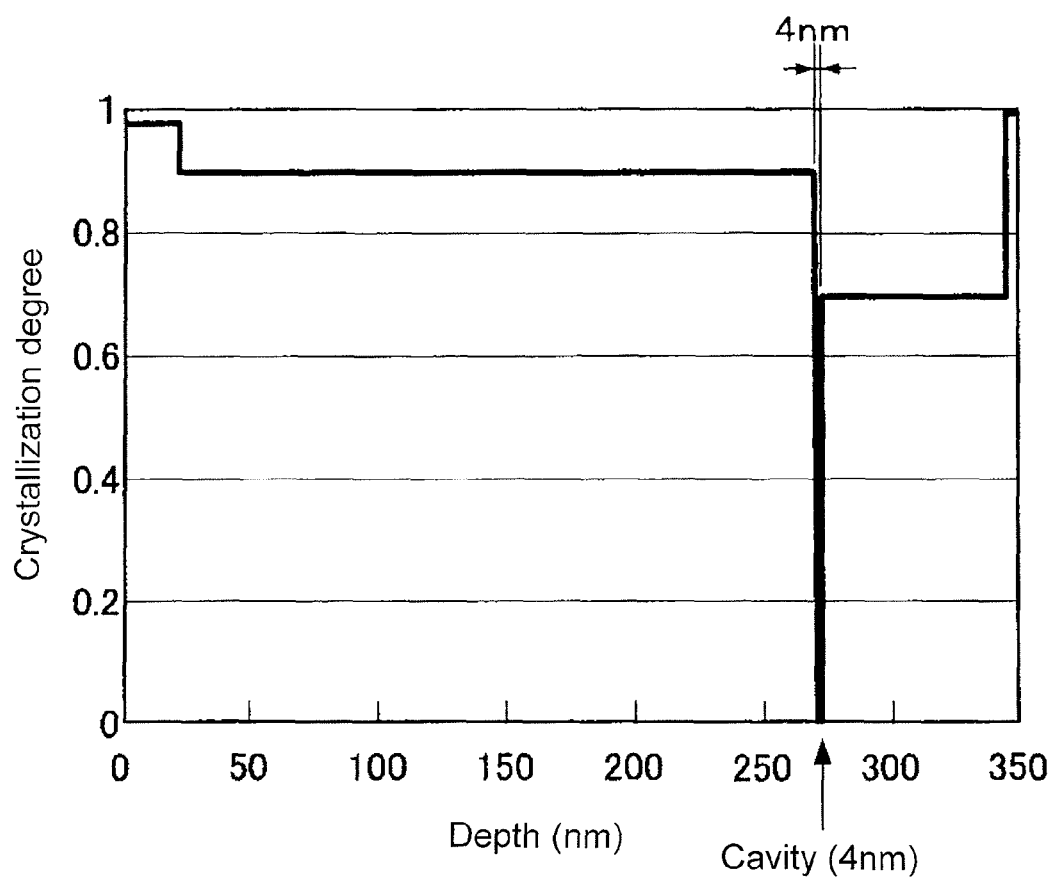
FIG. 7 shows a depth profile of a crystallization degree of a semiconductor substrate obtained from a numerical analysis of the optical reflectivity spectrum shown in FIG. 6.

At the next step, in the same manner as above, the experimental value of the optical reflectivity spectrum shown in FIG. 6 was numerically analyzed and a depth profile of crystallization rates was calculated. The calculated depth profile is shown in FIG. 7. The optical reflectivity spectrum calculated in this way is shown with a broken line in FIG. 6 as a calculated value.

It can be seen from FIG. 7 that the crystallization rate in the region from the surface up to a depth of 270 mm has improved, and the crystal structure is recovered due to heating of the semiconductor substrate 1 by irradiating with the light beam. Formation of a thin space of a width 4 nm and a deflection coefficient of approximately 1, i.e., a cavity at the depth of 270 nm was also observed. This cavity indicates that minute bubbles were formed in a high density at an edge of hydrogen molecular ion implantation. The diameters of the bubbles were measured and found to be approximately 4 nm. On the other hand, with the conventional method of performing the bubble layer forming process by a heat process at a temperature in the temperature range of approximately 400° C. to 700° C., the diameter of the bubbles was approximately 10 nm. Accordingly, it was confirmed that the diameter of the bubbles can be scaled down to approximately ⅖ by using the method according to the embodiments.

As explained above, according to the present invention, the roughness of the cleaving surface cleaved along the bubble layer can be reduced since the bubbles forming the bubble layer can be scaled down. As a result, the polishing work to flatten the surface of the semiconductor thin film can be reduced. As a result, the TAT and the yield can be improved.

What is claimed is:

1. A manufacturing method of a thin film semiconductor substrate comprising:
    implanting ions at a specified depth into a semiconductor substrate;
    forming a bubble layer in the semiconductor substrate by vaporizing the implanted ions;
    bonding an insulating substrate onto the semiconductor substrate, on a surface on which the implanting has been performed; and
    cleaving the semiconductor substrate along the bubble layer to form a semiconductor thin film on a side of the insulating substrate,
    wherein the forming includes heating the semiconductor substrate at a temperature in a temperature range of approximately 1000° C. to 1200° C. for a duration in a range of approximately 10 microseconds to 100 milliseconds.

2. The manufacturing method according to claim 1, wherein the forming includes heating the semiconductor substrate by irradiating the semiconductor substrate with an energy beam.

3. The manufacturing method according to claim 2, wherein the forming includes scanning a surface of the semiconductor substrate with the energy beam.

4. The manufacturing method according to claim 2, wherein the energy beam is a light beam of a wavelength that is absorbed by the semiconductor substrate.

5. The manufacturing method according to claim 3, wherein the energy beam is a line beam.

6. The manufacturing method according to claim 1, further comprising heating the semiconductor substrate, before the forming, at a temperature lower than a boiling point of the semiconductor substrate.

7. The manufacturing method according to claim 1, further comprising flattening a surface of the semiconductor thin film of the semiconductor substrate.

8. The manufacturing method according to claim 1, further comprising recrystallizing a semiconductor material constituting the semiconductor thin film by heating the semiconductor thin film after the cleaving.

9. The manufacturing method according to claim 2, wherein the bonding is performed before the forming, and the forming includes irradiating the semiconductor substrate with the energy beam from a side of the insulating substrate.

* * * * *